United States Patent
Liu et al.

(10) Patent No.: US 8,848,313 B1
(45) Date of Patent: *Sep. 30, 2014

(54) THERMAL SOLUTION FOR DRIVE SYSTEMS SUCH AS HARD DISK DRIVES AND DIGITAL VERSATILE DISCS

(71) Applicant: Marvell International Ltd., Hamilton (BM)

(72) Inventors: Chenglin Liu, San Jose, CA (US); Shiann Liou, Cambell, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/742,062

(22) Filed: Jan. 15, 2013

Related U.S. Application Data

(60) Continuation of application No. 13/540,171, filed on Jul. 2, 2012, now Pat. No. 8,355,221, which is a continuation of application No. 13/154,339, filed on Jun. 6, 2011, now Pat. No. 8,218,261, which is a continuation of application No. 12/842,452, filed on Jul. 23, 2010, now Pat. No. 7,957,094, which is a division of application No. 11/495,295, filed on Jul. 28, 2006, now Pat. No. 7,764,462.

(60) Provisional application No. 60/759,164, filed on Jan. 13, 2006.

(51) Int. Cl.
*G11B 33/14* (2006.01)
*H05K 3/30* (2006.01)
*G06F 1/20* (2006.01)
*H05K 1/02* (2006.01)

(52) U.S. Cl.
CPC ............... *H05K 1/0206* (2013.01); *H05K 3/30* (2013.01); *G06F 1/20* (2013.01)
USPC ...................................... 360/99.23

(58) Field of Classification Search
CPC ..... G11B 33/1426; H05K 1/0206; G06F 1/20
USPC ........................................ 360/97.12, 99.23
See application file for complete search history.

(56) References Cited

U.S. PATENT DOCUMENTS 4,930,029 A  5/1990  Morita
4,965,684 A  10/1990 Stefansky (Continued)

FOREIGN PATENT DOCUMENTS

WO  WO 01/93456  12/2001

OTHER PUBLICATIONS

R1-0801108; 3GPP TSG-RAN 1 Meeting #52; Sorrento, Italy; Feb. 11-15, 2008; Way Forward on Dedicated Reference Signal Design for LTE downlink with Normal CP; Motorola, Nortel Broadcomm, Nokia, NSN, NTT DoCoMo, NEC, Mitsubishi, Alcatel-Lucent, CATT, Huawei, Sharp, Texas Instrument, ZTE, Panasonic, Philips, Toshiba; 2 pages.

(Continued)

*Primary Examiner* — Angel Castro

(57) ABSTRACT

A system including a printed circuit board having a plurality of vias, a first integrated circuit mounted on a first surface of the printed circuit board, and a casing mounted on a second surface of the printed circuit board. The first surface of the printed circuit board is opposite to the second surface of the printed circuit board. Each of the plurality of vias has (i) a first end extending to the first surface of the printed circuit board and (ii) a second end extending to the second surface of the printed circuit board. The first integrated circuit is in thermal contact with the first ends of the plurality of vias. The casing is in thermal contact with the second ends of the plurality of vias.

12 Claims, 10 Drawing Sheets

(56) References Cited

U.S. PATENT DOCUMENTS

| | | | |
|---|---|---|---|
| 5,169,703 A | 12/1992 | Miyazaki et al. | |
| 5,245,486 A | 9/1993 | Hachiya et al. | |
| 5,790,343 A | 8/1998 | Takano et al. | |
| 5,844,747 A * | 12/1998 | Wang | 360/99.18 |
| 5,870,247 A * | 2/1999 | Schirle | 360/97.13 |
| 6,057,982 A | 5/2000 | Kloeppel | |
| 6,320,723 B1 * | 11/2001 | Bernett | 360/97.13 |
| 6,411,516 B1 * | 6/2002 | Palumbo et al. | 361/704 |
| 6,519,110 B2 | 2/2003 | Dague et al. | |
| 6,711,812 B1 * | 3/2004 | Lu et al. | 29/852 |
| 6,754,041 B2 * | 6/2004 | Hong et al. | 360/99.18 |
| 6,831,833 B2 | 12/2004 | Kim et al. | |
| 7,006,355 B2 | 2/2006 | Wakabayashi et al. | |
| 7,102,854 B2 | 9/2006 | Wang et al. | |
| 7,149,045 B1 | 12/2006 | Mallary et al. | |
| 7,274,533 B2 | 9/2007 | Kimura et al. | |
| 7,298,583 B2 | 11/2007 | Miyazaki et al. | |
| 7,365,938 B2 | 4/2008 | Yoo | |
| 7,383,557 B2 | 6/2008 | Toyoda et al. | |
| 7,461,933 B2 | 12/2008 | Deily et al. | |
| 7,486,475 B2 | 2/2009 | Biskeborn | |
| 7,502,200 B2 | 3/2009 | Aoki | |
| 7,589,962 B1 | 9/2009 | Bhatia | |
| 7,679,862 B2 | 3/2010 | Nakamoto et al. | |
| 7,751,156 B2 | 7/2010 | Mauri et al. | |
| 7,764,462 B1 | 7/2010 | Liu et al. | |
| 7,830,641 B2 | 11/2010 | Lin | |
| 7,869,218 B2 | 1/2011 | Ni et al. | |
| 7,944,703 B2 | 5/2011 | Ni et al. | |
| 7,957,094 B1 | 6/2011 | Liu et al. | |
| 2001/0049210 A1 * | 12/2001 | Pinteric et al. | 439/76.1 |
| 2002/0070444 A1 | 6/2002 | Turner | |
| 2004/0184128 A1 | 9/2004 | Mikami | |
| 2005/0152118 A1 * | 7/2005 | Cho | 361/707 |
| 2005/0160702 A1 | 7/2005 | Perreault et al. | |
| 2006/0001159 A1 | 1/2006 | Garcia et al. | |
| 2006/0006480 A1 | 1/2006 | Shinozaki et al. | |
| 2006/0021903 A1 | 2/2006 | Perreault et al. | |
| 2006/0024531 A1 | 2/2006 | Murakami | |
| 2006/0109621 A1 * | 5/2006 | Mojaver et al. | 361/687 |
| 2006/0124585 A1 | 6/2006 | Suwa et al. | |
| 2006/0158049 A1 | 7/2006 | Suzuki et al. | |
| 2007/0121286 A1 | 5/2007 | Foster et al. | |
| 2007/0189240 A1 | 8/2007 | Cho et al. | |
| 2007/0230068 A1 | 10/2007 | Gill | |
| 2008/0080101 A1 | 4/2008 | Mauri et al. | |
| 2008/0204945 A1 | 8/2008 | Freitag et al. | |
| 2008/0212700 A1 | 9/2008 | Han et al. | |
| 2008/0259507 A1 | 10/2008 | Lin | |
| 2009/0168267 A1 | 7/2009 | Lin | |
| 2009/0168269 A1 | 7/2009 | Carey et al. | |
| 2009/0323228 A1 | 12/2009 | Carey et al. | |
| 2010/0302681 A1 | 12/2010 | Mino et al. | |

OTHER PUBLICATIONS

OFDM and MC-CDMA for Broadband Multi-User Communications, WLANs and Broadcasting; L. Hanzo, M. Munster, B.J. Choi and T. Keller; All of University of Southhampton, UK; 2003; 65 pages.

Banister et al., "Feedback Assisted Stochstic Gradient Adaptation of Multiantenna Transmission," IEEE Transactions on Wireless Communications, vol. 4, No. 3, May 1, 2005; pp. 1121-1135; Abstract: p. 1122.

Notification of Transmittal of the International Search Report and Written Opinion dated Sep. 16, 2009, for related International Application No. PCT/IB2009/005099; 15 pages.

* cited by examiner

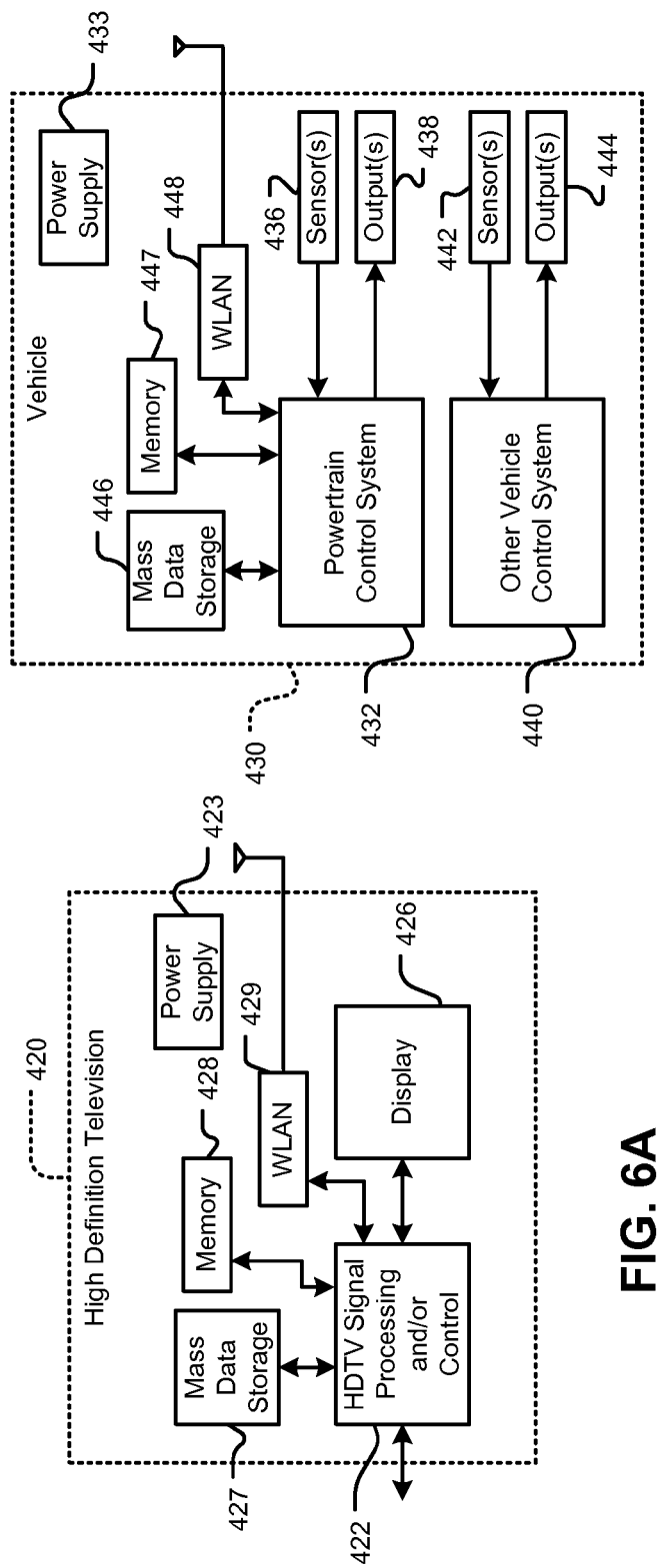

THERMAL SOLUTION FOR DRIVE SYSTEMS SUCH AS HARD DISK DRIVES AND DIGITAL VERSATILE DISCS

CROSS-REFERENCE TO RELATED APPLICATIONS

The present disclosure is a continuation of U.S. patent application Ser. No. 13/540,171 (now U.S. Pat. No. 8,355,221), filed on Jul. 2, 2012, which is a continuation of U.S. patent application Ser. No. 13/154,339 (now U.S. Pat. No. 8,218,261), filed on Jun. 6, 2011, which is a continuation of U.S. patent application Ser. No. 12/842,452 (now U.S. Pat. No. 7,957,094), filed on Jul. 23, 2010, which is a divisional of U.S. patent application Ser. No. 11/495,295 (now U.S. Pat. No. 7,764,462), filed on Jul. 28, 2006, which claims the benefit of U.S. Provisional Application No. 60/759,164, filed on Jan. 13, 2006. The entire disclosures of the above referenced applications are incorporated herein by reference.

FIELD

The present disclosure relates to hard disk drives (HDD).

BACKGROUND

Electronic devices such as computers, laptops, personal video recorders (PVRs), MP3 players, game consoles, set-first boxes, digital cameras, and other electronic devices often need to store a large amount of data. Storage devices such as hard disk drives (HDDs) and digital versatile discs (DVDs) may be used to meet these storage requirements. As the size of these devices decreases, heat dissipation has become more problematic.

Referring now to FIG. 1A, hard disk drive (HDD) 10 includes a hard drive assembly (HDA) printed circuit board assembly (PCBA) 14. A buffer module 18 stores data that is associated with control of the HDD 10. The buffer module 18 may employ SDRAM or other types of low latency memory. A processor 22 that is arranged on the HDA PCBA 14 performs processing that is related to the operation of the HDD 10. A hard disk control module (HDC) 26 communicates with an input/output interface 24 and with a spindle/voice coil motor (VCM) driver module 30 and/or a read/write channel module 34.

During write operation, read/write channel module 34 encodes the data to be written via a read/write device 59, as described in detail hereinbelow. The read/write channel module 34 processes the signal for reliability and may include, for example, error correction coding (ECC), run length limited coding (RLL), and the like. During read operation, the read/write channel module 34 converts an analog output of the read/write device 59 to a digital signal. The converted signal is then detected and decoded by known techniques to recover the data written on the HDD.

As can be appreciated, one or more of the functional blocks of the HDA PCBA 14 may be implemented by a single integrated circuit (IC) or chip. For example, a first integrated circuit 1C-1 may include the buffer module 18 and the processor 22. A second integrated circuit 1C-2 may implement the HDC module 26, the spindle VCM module 30, the read write channel module 34 and/or the I/O interface 24. Still other component combinations may be implemented as integrated circuit(s). For example, the processor 22 and the HDC module 26 may be implemented by a single integrated circuit. The spindle/VCM driver module 30 and/or the read/write channel module 34 may also be implemented by the same integrated circuit as the processor 22 and/or the HDC module 26.

A hard drive assembly (HDA) case 50 provides a housing for one or more hard drive platters 52, which include a magnetic coating that stores magnetic fields. The platters 52 are rotated by a spindle motor 54. Generally the spindle motor 54 rotates the hard drive platter 52 at a fixed speed during the read/write operations. One or more read/write arms 58 move relative to the platters 52 to read and/or write data to/from the hard drive platters 52. The spindle/VCM driver module 30 controls the spindle motor 54, which rotates the platter 52. The spindle/VCM driver module 30 also generates control signals that position the read/write arm 58, for example using a voice coil actuator, a stepper motor or any other suitable actuator.

The read/write device 59 is located near a distal end of the read/write arm 58. The read/write device 59 includes a write element such as an inductor that generates a magnetic field. The read/write device 59 also includes a read element (such as a magneto-resistive (MR) element) that senses the magnetic field on the platter 52. A preamp module 60 amplifies analog read/write signals. When reading data, the preamp module 60 amplifies low level signals from the read element and outputs the amplified signal to the read/write channel device. While writing data, a write current is generated which flows through the write element of the read/write device 59 is switched to produce a magnetic field having a positive or negative polarity. The positive or negative polarity is stored by the hard drive platter 52 and is used to represent data.

Referring now to FIG. 1B, an exemplary DVD system 61. A DVD PCBA 62 includes a buffer 64 that stores read data, write data and/or volatile control code that is associated the control of the DVD system 61. The buffer 64 may employ volatile memory such as SDRAM or other types of low latency memory. Nonvolatile memory 66 such as flash memory can also be used for critical data such as data relating to DVD write formats and/or other nonvolatile control code. A processor 68 arranged on the DVD PCBA 62 performs data and/or control processing that is related to the operation of the DVD system 61. The processor 68 also performs decoding of copy protection and/or compression/decompression as needed. A DVD control module 70 communicates with an input/output interface 72 and with a spindle/feed motor (FM) driver 74 and/or a read/write channel module 76. The DVD control module 70 coordinates control of the spindle/FM driver 74, the read/write channel module 76 and the processor 68 and data input/output via the interface 72.

During write operations, the read/write channel module 76 encodes the data to be written by an optical read/write (ORW) or optical read only (OR) device 78 to the DVD platter. The read/write channel module 76 processes the signals for reliability and may apply, for example, ECC, RLL, and the like. During read operations, the read/write channel module 76 converts an analog output of the ORW or OR device 78 to a digital signal. The converted signal is then detected and decoded by known techniques to recover the data that was written on the DVD.

A DVD assembly (DVDA) 82 includes a DVD medium 84 that stores data optically. The medium 84 is rotated by a spindle motor that is schematically shown at 86. The spindle motor 86 rotates the DVD medium 84 at a controlled and/or variable speed during the read/write operations. The ORW or OR device 78 moves relative to the DVD medium 84 to read and/or write data to/from the DVD medium 84. The ORW or OR device 78 typically includes a laser and an optical sensor.

For DVD read/write and DVD read only systems, the laser is directed at tracks on the DVD that contain lands and pits during read operations. The optical sensor senses reflections caused by the lands/pits. In some DVD read/write (RW) applications, a laser may also be used to heat a die layer on the DVD platter during write operations. If the die is heated to one temperature, the die is transparent and represents one binary digital value. If the die is heated to another temperature, the die is opaque and represents the other binary digital value. Other techniques for writing DVDs may be employed.

The spindle/FM driver 74 controls the spindle motor 80, which controllably rotates the DVD medium 84. The spindle/FM driver 74 also generates control signals that position the feed motor 90, for example using a voice coil actuator, a stepper motor or any other suitable actuator. The feed motor 90 typically moves the ORW or OR device 78 radially relative to the DVD medium 84. A laser driver 92 generates a laser drive signal based on an output of the read/write channel module 76. The DVDA 82 includes a preamp circuit 93 that amplifies analog read signals. When reading data, the preamp circuit 93 amplifies low level signals from the ORW or OR device and outputs the amplified signal to the read/write channel module device 76.

The DVD system 61 may further include a codec module 94 that encodes and/or decodes video such as any of the MPEG formats. A scrambler 97 may be used to perform data scrambling. Audio and/or video digital signal processors and/or modules 96 and 95, respectively, perform audio and/or video signal processing, respectively.

SUMMARY

A drive system including: a printed circuit board; a first integrated circuit mounted onto the printed circuit board; a drive assembly case that is connected to the printed circuit board; and a first thermal interface material thermally coupled between i) the printed circuit board and ii) the drive assembly case. Thermal energy generated by the first integrated circuit is dissipatable by the drive assembly case through the first interface material.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6A is a functional block diagram of a high definition television;

FIG. 6B is a functional block diagram of a vehicle control system;

DETAILED DESCRIPTION

Figure 1A:
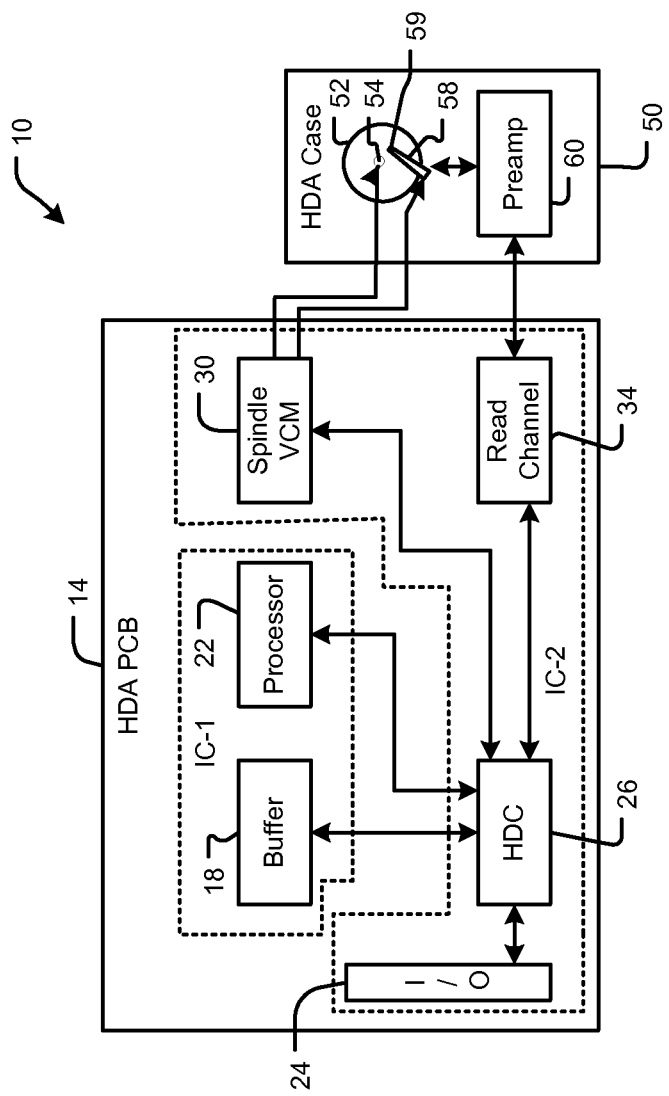
FIG. 1A is a functional block diagram of an exemplary hard disk drive according to the prior art.
Figure 1B:
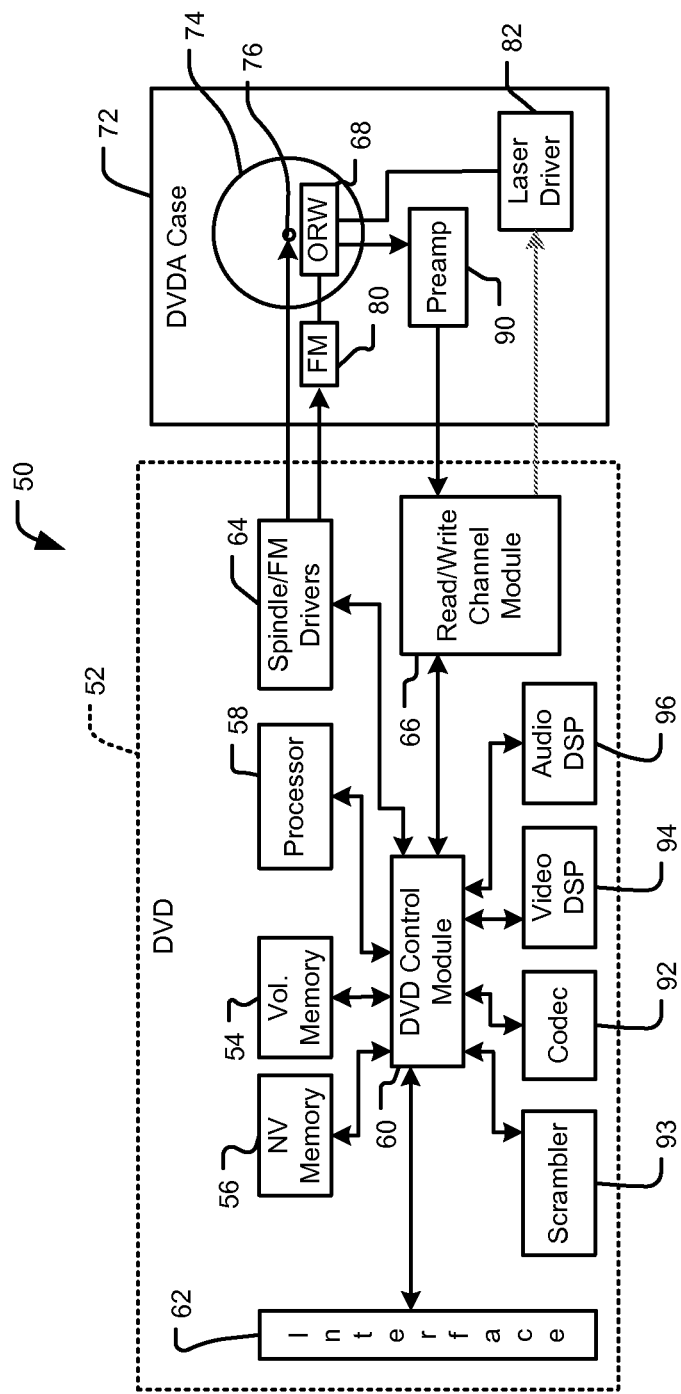
FIG. 1B is a functional block diagram of an exemplary digital versatile disc (DVD) according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

The present disclosure relates to a low cost thermal solution for dissipating heat when high power integrated circuits (ICs) are used in drive systems. For example, the present invention may be used in hard disk drive (HDD) and digital versatile disc (DVD) systems. The HDD includes a hard disk assembly (HDA) and a HDD printed circuit board assembly (HDD PCBA) with one or more Integrated Circuits (ICs) and/or other electronics components mounted thereon. Some types of HDDs include an external case that is connected to the HDD PCB. While the certain portions of the present disclosure relate to HDD systems, the present disclosure can also be used to dissipate heat within DVD systems.

The ICs tend to generate a lot of heat due to high data flow speeds of the HDD or DVD and integration of more functions and features. As the form factor of the HDD or DVD becomes smaller, the PCB also becomes smaller. Dissipating heat generated by the IC or ICs of the PCB becomes more challenging. According to the present disclosure, the drive assembly case can be used as a thermal heatsink by making the surface of one or more ICs directly contact the drive assembly case and/or using a thermal interface material to allow the thermal contact between the IC or ICs and the drive assembly case.

Figure 2A:
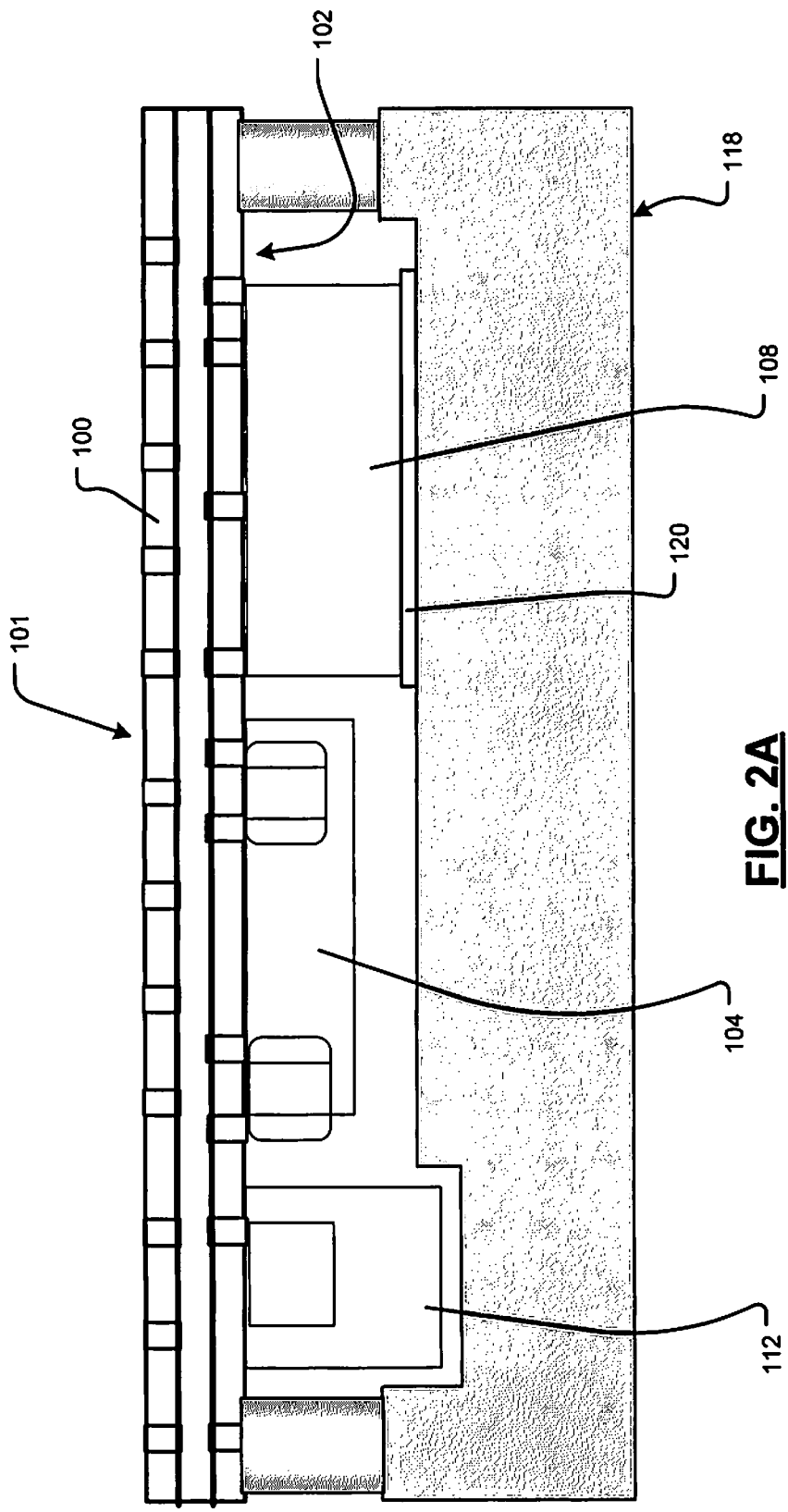
FIG. 2A illustrates a first drive system that is thermally coupled to a drive assembly case according to the present disclosure.
Figure 2B:
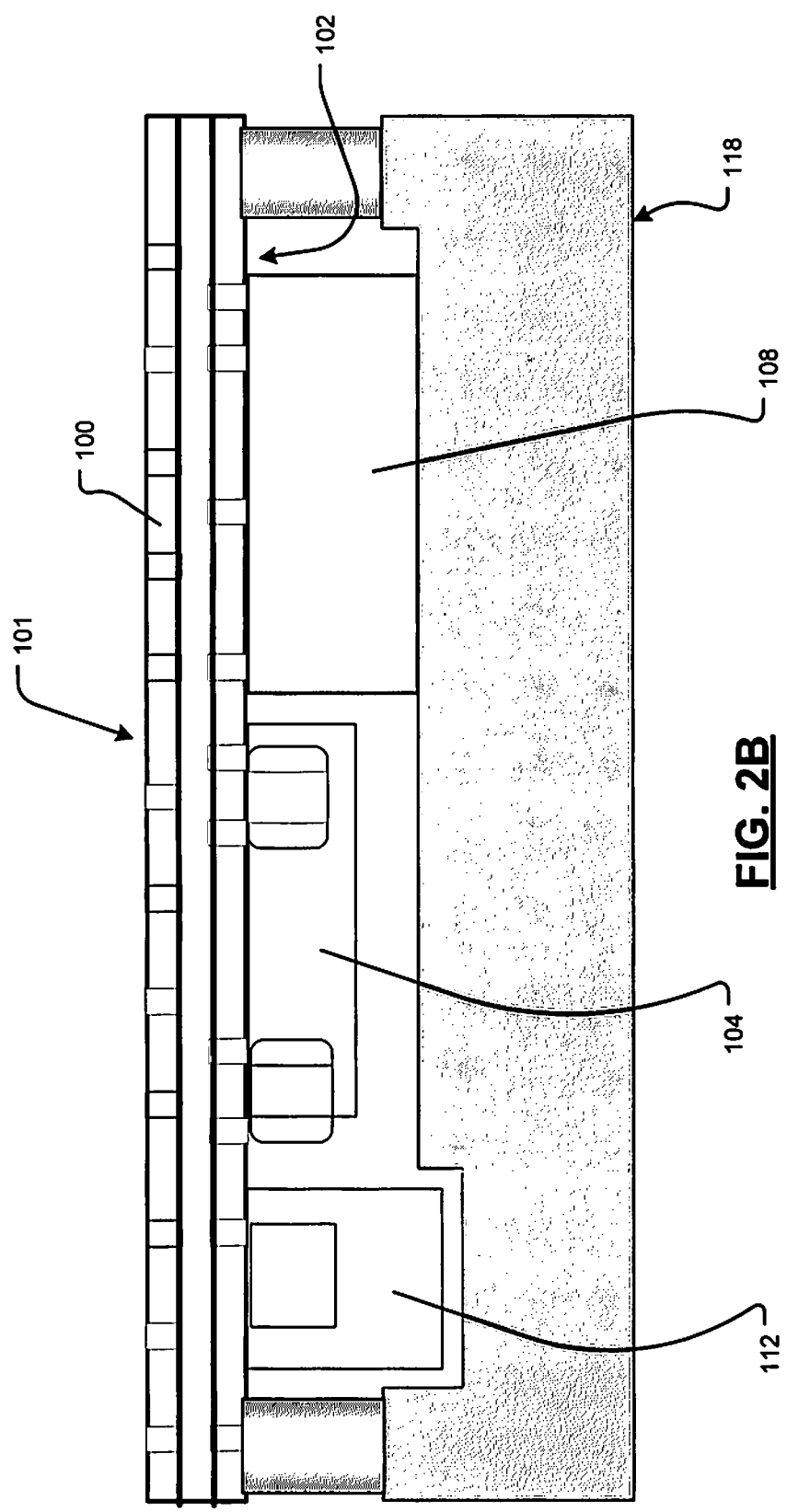
FIG. 2B illustrates the first drive system with an integrated circuit in direct physical contact with the drive assembly case.

Referring now to FIGS. 2A and 2B, the drive assembly case can be used as a thermal heatsink by making the printed circuit board (PCB) contact the drive assembly case through a thermal interface material. More particularly, in FIG. 2A a PCB 100 includes an outer side 101 and an inner side 102. First and second integrated circuits (ICs) 104 and 108 and/or other components 112 are mounted on the outer and/or inner sides 101 and 102 of the PCB 100.

A drive assembly case 118 is connected to the inner side 102 of the PCB 100. A second side of the IC 108 includes a thermal interface material 120 that is located between the IC 108 and the drive assembly case 118. The terminal interface material 120 thermally couples the second side of the IC 108 to the drive assembly case 118. As a result, heat generated by the IC 108 is dissipated by the relatively large surface area of the drive assembly case 118. In FIG. 2B, the IC 108 directly contacts the drive assembly case 118.

Figure 3:
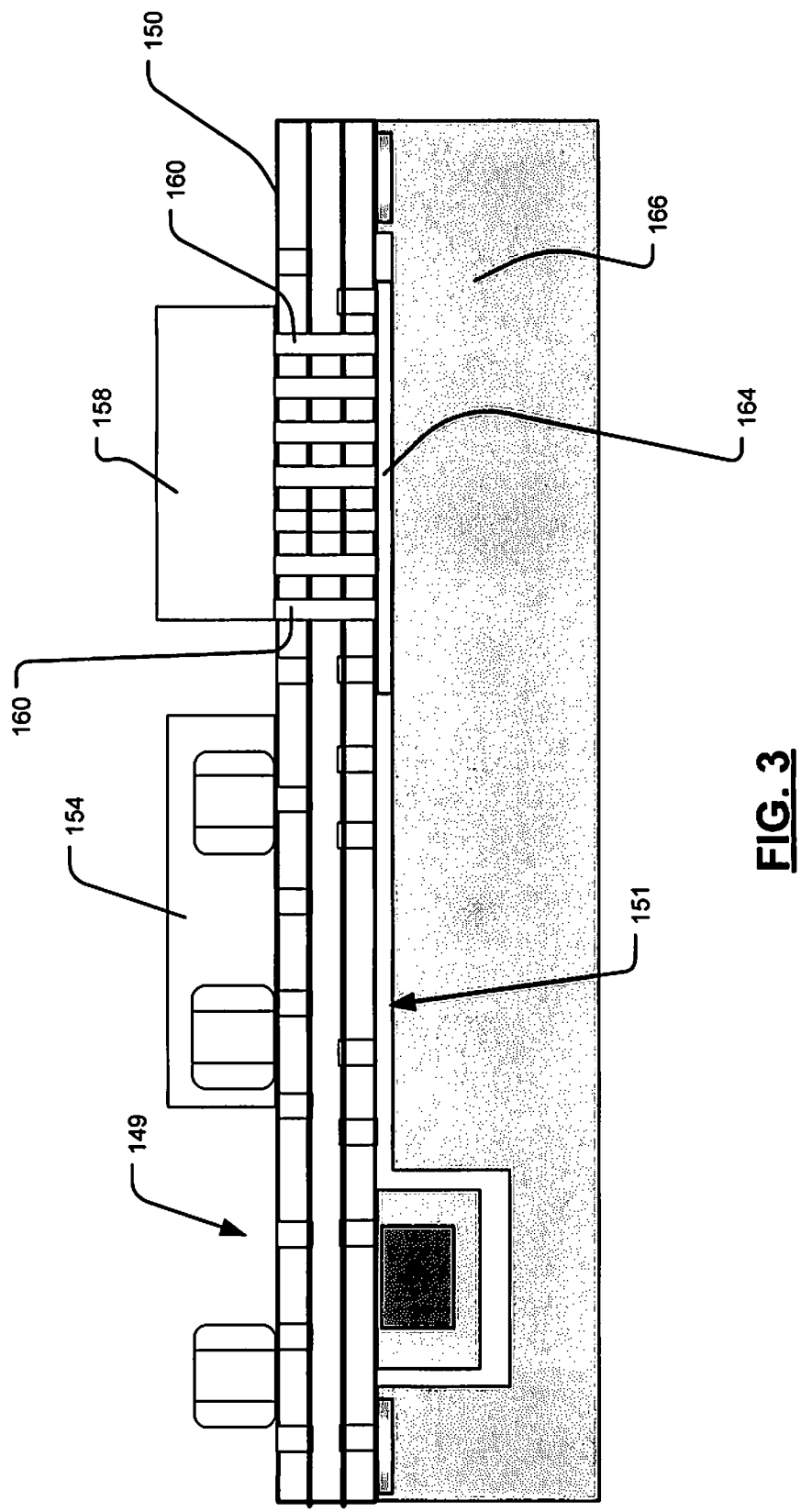
FIG. 3 illustrates a second drive system that is thermally coupled to a drive assembly case according to the present disclosure.

Referring now to FIG. 3, additional thermal vias can be added at the contact area of PCB to further improve thermal performance. One side 149 of a PCB 150 includes first and second ICs 154 and 158 and/or other components 155. The PCB 150 includes vias 160 that extend from the one side 149 of the PCB 150 to another side 151 thereof. A thermal interface material 164 thermally couples opposite ends of the vias 160 of the PCB 150 to a drive assembly case 166. Other components of the HDD or DVD may be connected to either side of the PCB 150 as shown. Direct contact between the vias and the drive assembly case can also be used.

Figure 4:
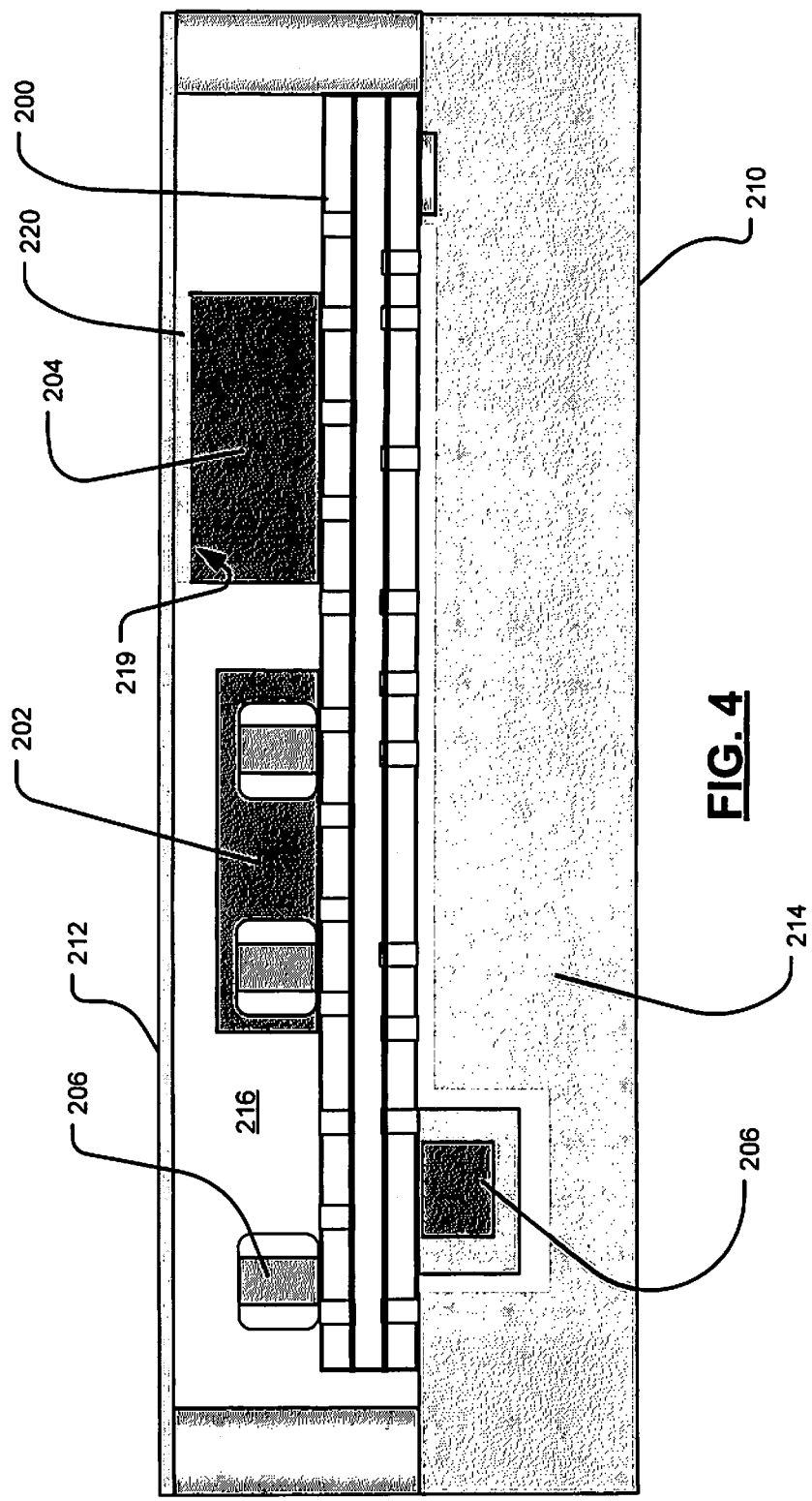
FIG. 4 illustrates a third drive system that is thermally coupled to a drive assembly case according to the present disclosure.

Referring now to FIG. 4, for HDDs or DVDs with the external cases over the PCB, the external case can be used as a thermal heatsink by making the surface of one or more ICs directly contact the external case and/or through a thermal interface material. A PCB 200 includes first and second ICs 202 and 204 and/or other components 206 mounted thereon. The PCB 200 is mounted to the drive assembly case 210 and covered by an external cover 212. The IC 204 includes an outer surface 219 that contacts a thermal interface material 220. The thermal interface material 220, in turn, contacts the external cover 212.

Figure 5:
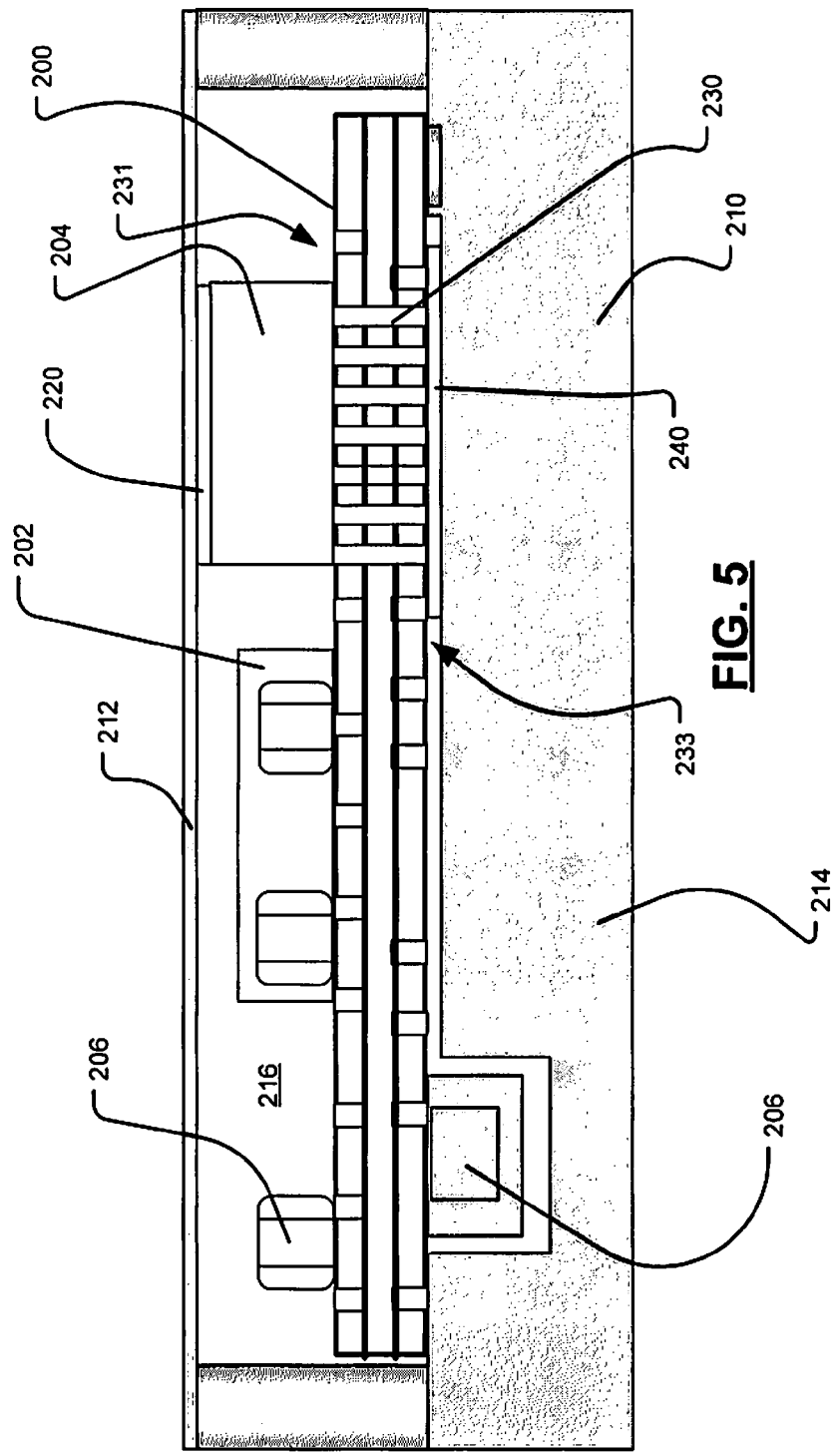
FIG. 5 illustrates a fourth drive system that is thermally coupled to a drive assembly case according to the present disclosure.

Referring now to FIG. 5, more thermal vias can be added at the contact area of PCB to further improve the thermal performance. The PCB 200 includes vias 230 that extend through and/or provide a thermal path through the PCB 200. A thermal interface material 240 provides a thermal path between the vias and the drive assembly case 210.

As can be appreciated, while only one IC is shown in contact with the drive assembly case in FIGS. 2-5, the solution can be applied to two or more ICs on the PCB. Furthermore, while FIG. 2B shows direct physical contact between the drive assembly case and the IC, FIGS. 3-5 may also be arranged in direct physical contact as well. Furthermore, embodiments may include ICs in direct and/or indirect contact via the thermal interface material.

Suitable examples of thermal interface materials include thermal conductive adhesive tape, thermal conductive elastomer, thermal conductive compound and thermal grease although other thermal interface materials can be used.

Referring now to FIG. 6A, the present invention can be implemented in mass data storage and/or a DVD of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 6B, the present invention may implement and/or be implemented in mass data storage of a vehicle control system and/or a vehicle-based DVD. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 6C:
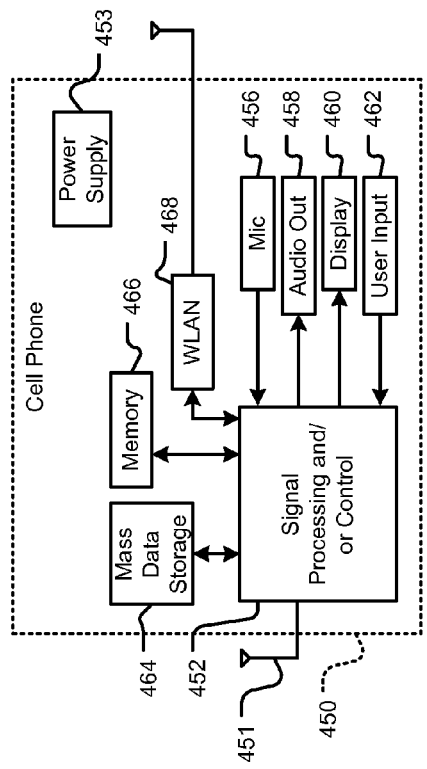
FIG. 6C is a functional block diagram of a cellular phone.

Referring now to FIG. 6C, the present invention can be implemented in mass data storage and/or a DVD of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 6D:
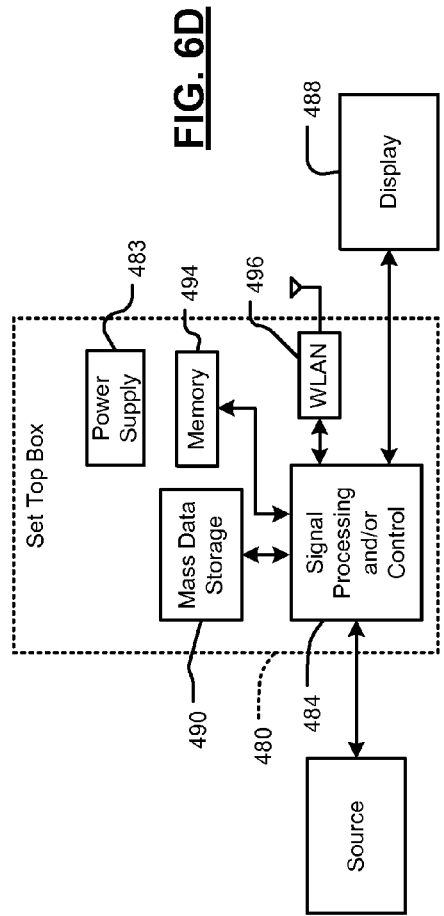
FIG. 6D is a functional block diagram of a set top box.

Referring now to FIG. 6D, the present invention can be implemented in mass data storage and/or a DVD of a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 6E:
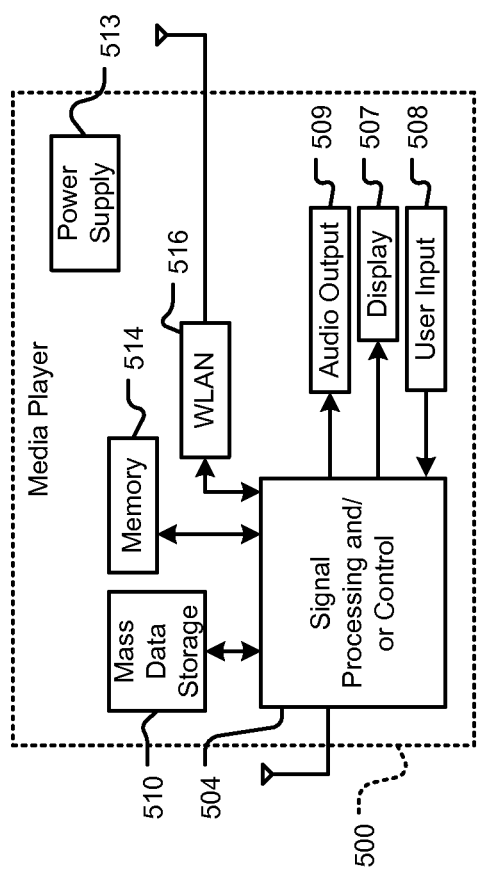
FIG. 6E is a functional block diagram of a media player.

Referring now to FIG. 6E, the present invention can be implemented in mass data storage and/or a DVD of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A system, comprising:
    a printed circuit board including a plurality of vias, wherein each of the plurality of vias has (i) a first end extending to a first surface of the printed circuit board and (ii) a second end extending to a second surface of the printed circuit board, and wherein the first surface of the printed circuit board is opposite to the second surface of the printed circuit board;
    a first integrated circuit mounted on the first surface of the printed circuit board, wherein the first integrated circuit is in thermal contact with the first ends of the plurality of vias; and
    a casing mounted on the second surface of the printed circuit board, wherein the drive assembly case is in thermal contact with the second ends of the plurality of vias.

2. The system of claim 1, further comprising a thermal interface material, wherein the drive assembly case is thermally coupled to the second ends of the plurality of vias by the thermal interface material.

3. The system of claim 1, wherein the drive assembly case dissipates heat generated by the first integrated circuit.

4. The system of claim 1, wherein the drive assembly case is attached to a device configured to store data.

5. The system of claim 1, further comprising:
    a second integrated circuit mounted on the first surface of the printed circuit board,
    wherein the second integrated circuit is in thermal contact with the first ends of the plurality of vias, and
    wherein the drive assembly case dissipates heat generated by the second integrated circuit.

6. A storage device comprising the system of claim 1, wherein the storage device includes a hard disk drive or an optical disc drive.

7. A computing device comprising the storage device of claim 6, wherein the computing device includes a computer, a laptop, a personal video recorder, an MP3 player, a game console, or a digital camera.

8. A method, comprising:
    mounting a first integrated circuit on a printed circuit board, wherein the printed circuit board includes a plurality of vias, wherein each of the plurality of vias has (i) a first end extending to a first surface of the printed circuit board and (ii) a second end extending to a second surface of the printed circuit board, wherein the first surface of the printed circuit board is opposite to the second surface of the printed circuit board, and wherein the first integrated circuit is in thermal contact with the first ends of the plurality of vias; and
    mounting a drive assembly case on the second surface of the printed circuit board, wherein the casing is in thermal contact with the second ends of the plurality of vias.

9. The method of claim 8, further comprising thermally coupling the drive assembly case to the second ends of the plurality of vias by a thermal interface material.

10. The method of claim 8, wherein the drive assembly case dissipates heat generated by the first integrated circuit.

11. The method of claim 8, further comprising attaching the drive assembly case to a device configured to store data.

12. The method of claim 8, further comprising:
    mounting a second integrated circuit mounted on the first surface of the printed circuit board,
    wherein the second integrated circuit is in thermal contact with the first ends of the plurality of vias, and
    wherein the drive assembly case dissipates heat generated by the second integrated circuit.

* * * * *